United States Patent
Kim et al.

(10) Patent No.: US 9,223,651 B2
(45) Date of Patent: Dec. 29, 2015

(54) DATA PROCESSING SYSTEM AND METHOD FOR RECORDING AND REPRODUCING HOLOGRAPHIC OPTICAL INFORMATION

(75) Inventors: Nak Young Kim, Seoul (KR); Pil Sang Yoon, Seoul (KR); Kyu Il Jung, Seoul (KR)

(73) Assignee: MAPLE VISION TECHNOLOGIES INC., Ottawa (CA)

( * ) Notice: Subject to any disclaimer, the term of this patent is extended or adjusted under 35 U.S.C. 154(b) by 2014 days.

(21) Appl. No.: 12/344,955

(22) Filed: Dec. 29, 2008

(65) Prior Publication Data

US 2009/0172497 A1 Jul. 2, 2009

(30) Foreign Application Priority Data

Dec. 27, 2007 (KR) .................... 10-2007-0139328

(51) Int. Cl.
  *G06F 11/00* (2006.01)
  *G06F 11/10* (2006.01)
  *H03M 13/31* (2006.01)

(52) U.S. Cl.
  CPC .......... *G06F 11/1076* (2013.01); *H03M 13/31* (2013.01); *G06F 11/1008* (2013.01)

(58) Field of Classification Search
  USPC ............... 714/763, 764; 365/125, 216, 235
  See application file for complete search history.

(56) References Cited

U.S. PATENT DOCUMENTS

| | | | | |
|---|---|---|---|---|
| 6,414,763 | B1* | 7/2002 | Hesselink et al. | 359/21 |
| 7,312,907 | B2* | 12/2007 | Kogure et al. | 359/25 |
| 2005/0036182 | A1* | 2/2005 | Curtis et al. | 359/15 |
| 2005/0270855 | A1* | 12/2005 | Earhart et al. | 365/189.05 |
| 2006/0087958 | A1* | 4/2006 | Hwang et al. | 369/275.1 |

FOREIGN PATENT DOCUMENTS

| | | |
|---|---|---|
| JP | 2002-015503 A | 1/2002 |
| KR | 10-2005-0099853 A | 10/2005 |

OTHER PUBLICATIONS

Office Action issued in Korean Patent Application No. 10-2007-139328 dated Jan. 28, 2014.

* cited by examiner

*Primary Examiner* — Joseph Kudirka
(74) *Attorney, Agent, or Firm* — Vector IP Law Group; Robert S. Babayi

(57) ABSTRACT

Provided is a data processing system for recording holographic optical information. The data processing system includes, a data interface constructing a data page by using data transmitted from a host information device, a memory storing data transmitted from the data interface, an encoder ECC-encoding data that is stored in the memory, and a modulator modulating the encoded data so as to record optical information. Accordingly, it is possible to efficiently transmit data when recording and reproducing holographic optical information.

12 Claims, 6 Drawing Sheets

DATA PROCESSING SYSTEM AND METHOD FOR RECORDING AND REPRODUCING HOLOGRAPHIC OPTICAL INFORMATION

CROSS-REFERENCE TO RELATED APPLICATION

This application claims the benefit of Korean Patent Application No. 10-2007-0139328, filed Dec. 27, 2007, the disclosure of which is hereby incorporated herein by reference in its entirety.

BACKGROUND OF THE INVENTION

1. Field of the Invention

The present invention relates to a data processing system and method for processing optical information, and more particularly, to a data processing system and method for processing holographic optical information by applying a digital communication interface.

2. Description of the Related Art

Optical information processing devices for processing optical data include holographic optical information processing devices. In the holographic optical information processing devices, a two-dimensional data page is recorded in a recording medium as interference patterns through interference of a signal beam and a reference beam. When the reference beam is incident onto a position where a hologram of an optical information recording medium is formed, the reference beam is diffracted at the position, thereby generating a reproduction beam. It is possible to recover original data by detecting the reproduction beam through an array of light receiving elements such as a complementary metal-oxide semiconductor (CMOS) or a charge coupled device (CCD) and decoding the reproduction beam.

Other conventional optical information processing devices such as CDs, DVDs, HD-DVDs, Blu-ray disks, and the like except the holographic optical information processing devices have similar data processing systems for a data interface with hosts (various information devices).

The conventional optical information processing devices include a host interface for being interfaced with the host information devices and include a digital data processor for handling data so as to reproduce data that is recorded in a recording medium or record data in the recording medium. In addition, the conventional optical information processing devices may include a copy protection circuit for encrypting reproduced data so as to prevent data that is recorded in a recording medium from being illegally copied.

In a case where the conventional optical information processing devices communicate data with other information devices through the host interface, data that is recorded or reproduced in and from the recording medium, and data recorded in the recording medium is sequential bit data.

However, unlike the conventional optical information processing devices, the holographic information processing device has a data format of a two-dimensional data page, when recording and reproducing data. Accordingly, the two-dimensional data page is recorded or reproduced by using one optical spot (that is, hologram).

Thus, unlike the conventional optical information processing devices, the holographic optical information processing device can record data only when a two-dimensional data page is prepared. In addition, the holographic optical information processing device reproduces data in units of a two-dimensional data page. Accordingly, a data processing system and method that is different from the conventional optical information processing devices is necessary.

The present invention provides a data processing system and method for processing holographic optical information by applying a digital communication interface.

SUMMARY OF THE INVENTION

According to an aspect of the present invention, there is provided a data processing system for recording holographic optical information, the data processing system comprising: a data interface constructing a data page by using data transmitted from a host information device; a memory storing data transmitted from the data interface; an encoder ECC-encoding data that is stored in the memory; and a modulator modulating the encoded data so as to record optical information.

According to another aspect of the present invention, there is provided a data processing system for reproducing holographic optical information, the data processing system comprising: a memory storing optical information of a data page reproduced by an optical information processing device; a demodulator demodulating the optical information stored in the memory; a decoder ECC-decoding data that is demodulated by the demodulator; and a data interface transmitting the ECC-decoded data to a host computer.

According to another aspect of the present invention, there is provided a method of processing data so as to record holographic optical information, the method comprising: setting a size of data corresponding to a data page for recording holographic optical information to a set counter; storing host data in a buffer by reverse counting the counter; and completing buffering of the data corresponding to the data page when the reverse counting process is completed.

According to another aspect of the present invention, there is provided a method of processing data so as to reproduce holographic optical information, the method comprising: storing data reproduced by an optical information processing device; setting a data transmission counter for transmitting the stored data to a host information device; transmitting data from a buffer to the host information device while reverse counting the counter; and terminating transmission of the data to the host information device when the reverse counting process is completed.

In a data processing system and method for processing optical information according to an embodiment of the present invention, it is possible to efficiently transmit data when recording or reproducing holographic optical information.

DETAILED DESCRIPTION OF THE INVENTION

Figure 1:
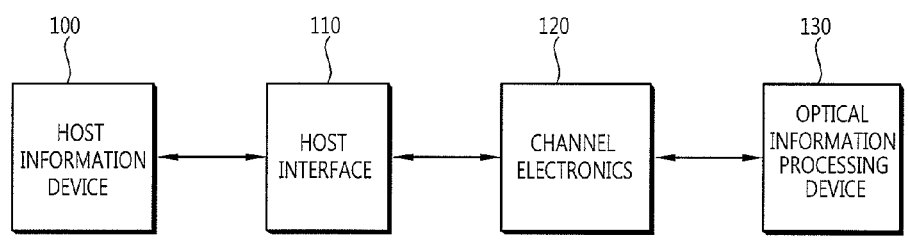
FIG. 1 is a block diagram illustrating a data processing system for processing holographic optical information.

FIG. 1 is a block diagram illustrating a data processing system for processing holographic optical information. As shown in FIG. 1, the data processing system includes a host information device 100 with a program for controlling a network and processing data and a host interface 110 for interfacing the host information device 100 with channel electronics 120.

The host interface 100 is embodied as a universal serial bus (USB) or a small computer system interface (SCSI). In addition, the host interface 110 is connected to the channel electronics 120 so as to process holographic optical information. The channel electronics 120 is connected to a holographic optical information processing device 130 for processing holographic optical information.

Figure 2:
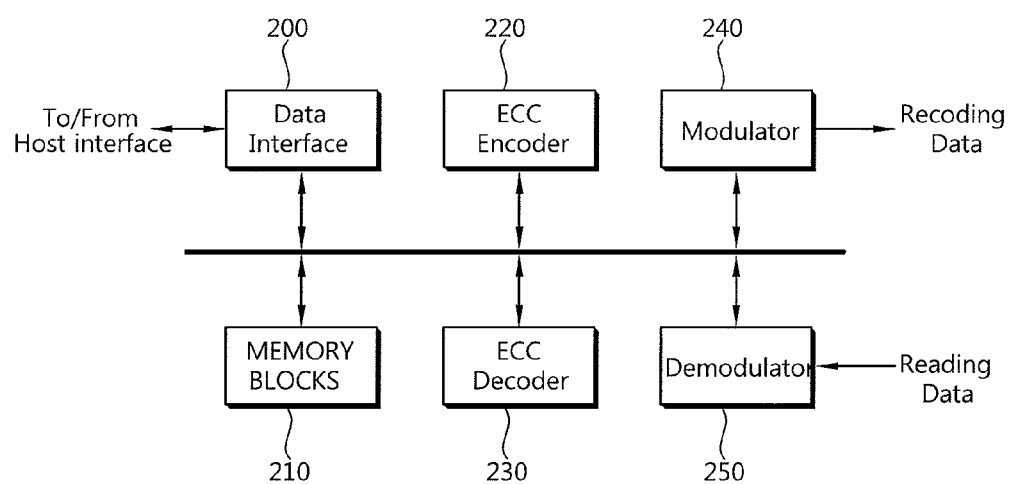
FIG. 2 is a block diagram illustrating channel electronics for processing holographic optical information.

On the other hand, FIG. 2 is a block diagram illustrating the channel electronics 120 for processing holographic optical information. As shown in FIG. 2, the channel electronics 120 includes a data interface 200 for inputting and output data to and from the host interface 110 and a memory block 210 that is a temporary storage memory for temporarily storing encoded data or decoded data obtained before and after inputting and outputting data into and to the data interface 200.

In addition, the channel electronics 120 includes an ECC encoder 220 for encoding data of the memory block 210 when recording data by correcting an error by generating parity in correspondence with a size of an ECC block and an ECC decoder 230 for decoding reproduced data when reproducing data by correcting an error. In addition, the channel electronics 120 include a modulator 240 for finally modulating data to be recorded and a demodulator 240 for demodulating data to be reproduced.

Figure 3:
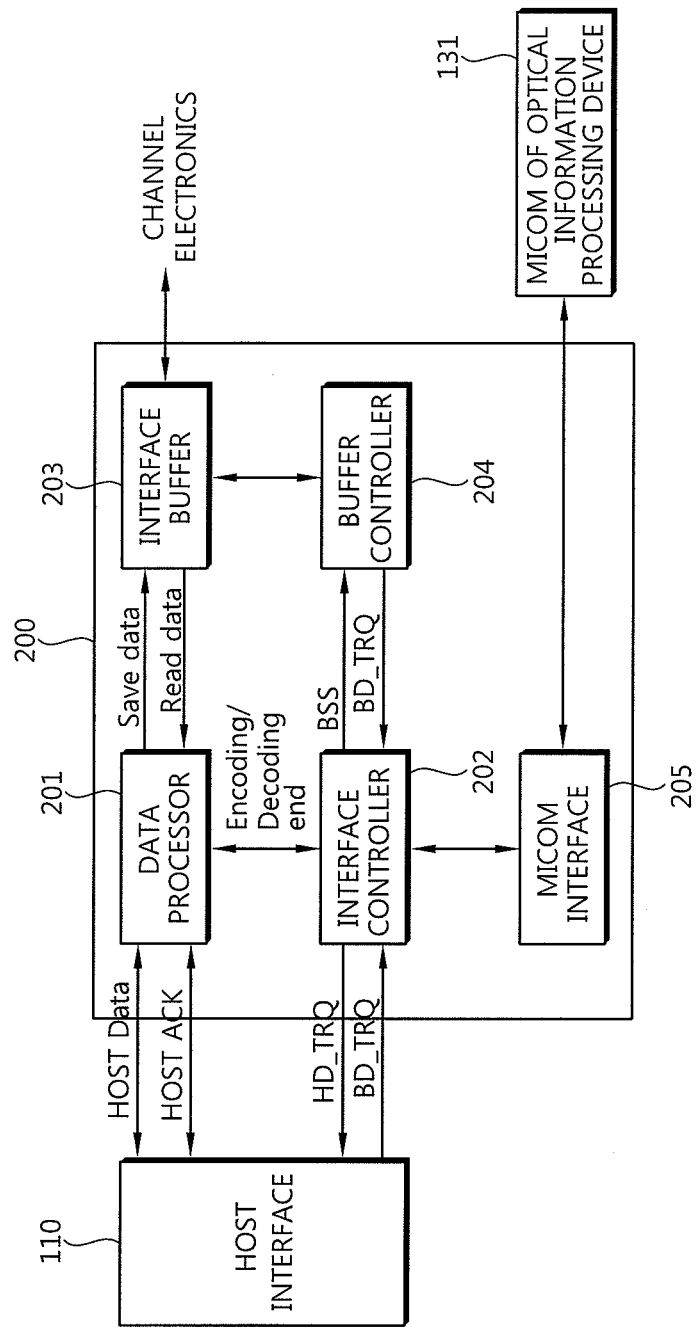
FIG. 3 is a block diagram illustrating a structure of a data interface for processing holographic optical information.

FIG. 3 is a block diagram illustrating a structure of the data interface 200 for processing holographic optical information. As shown in FIG. 3, the data interface 200 includes a data processor 201, an interface buffer 203, a buffer controller 204, and a micom interface 205. The data processor 201 processes data for an interface through which data and an ACK signal are input and output into and from the host. The data of the data processor 201 is temporarily stored or read in or from an interface buffer 203. The buffer controller 204 controls the interface buffer 204. The micom interface 205 is connected to a microcomputer 131 of the holographic optical information processing device 130.

In addition, the data interface 200 further includes an interface controller 202 which controls the buffer controller 204, the data processor 210, and the micom interface 205, transmits a signal for requesting transmission of host data (HD_TRQ) to the host interface 110, and receives a signal for requesting transmission of buffer data (BD_TRQ) from the host interface 110.

Figure 4:
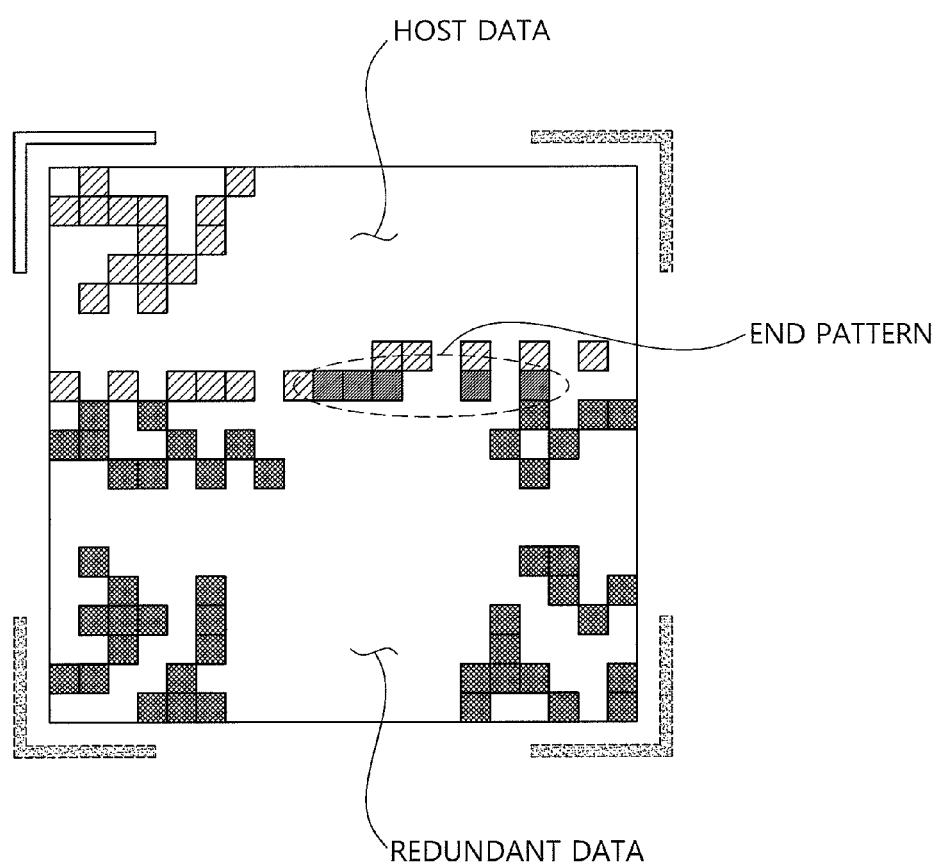
FIG. 4 illustrates an example of a data page for processing holographic optical information.

On the other hand, a spatial light modulator (SLM) displays bit data with a two-dimensional data page format. FIG. 4 illustrates an example of a data page for processing holographic optical information. As shown in FIG. 4, host data is modulated so that a bit corresponds to one or more pixels and displayed on the SLM. The host data may fill a data page. Alternatively, when the capacity of the host data is less than that of a data page, the modulated host data is modulated and displayed on a part of the data page.

Accordingly, as shown in FIG. 4, an upper part of a pixel array of the SLM represents host data to be recorded. End parts of the host data can represent end patterns which are modulated to one or more pixels so as to indicate ends of the host data. Data displayed on a pixel area subsequent to the end patterns may be defined as redundant data. This redundant data may not be transmitted to the host information device.

In order to construct a data page, various signal processing techniques such as an interleaving method may be employed. Accordingly, various methods of carrying and displaying data of a data page may be employed.

Hereinafter, a method of processing data to be recorded will be described.

Figure 5:
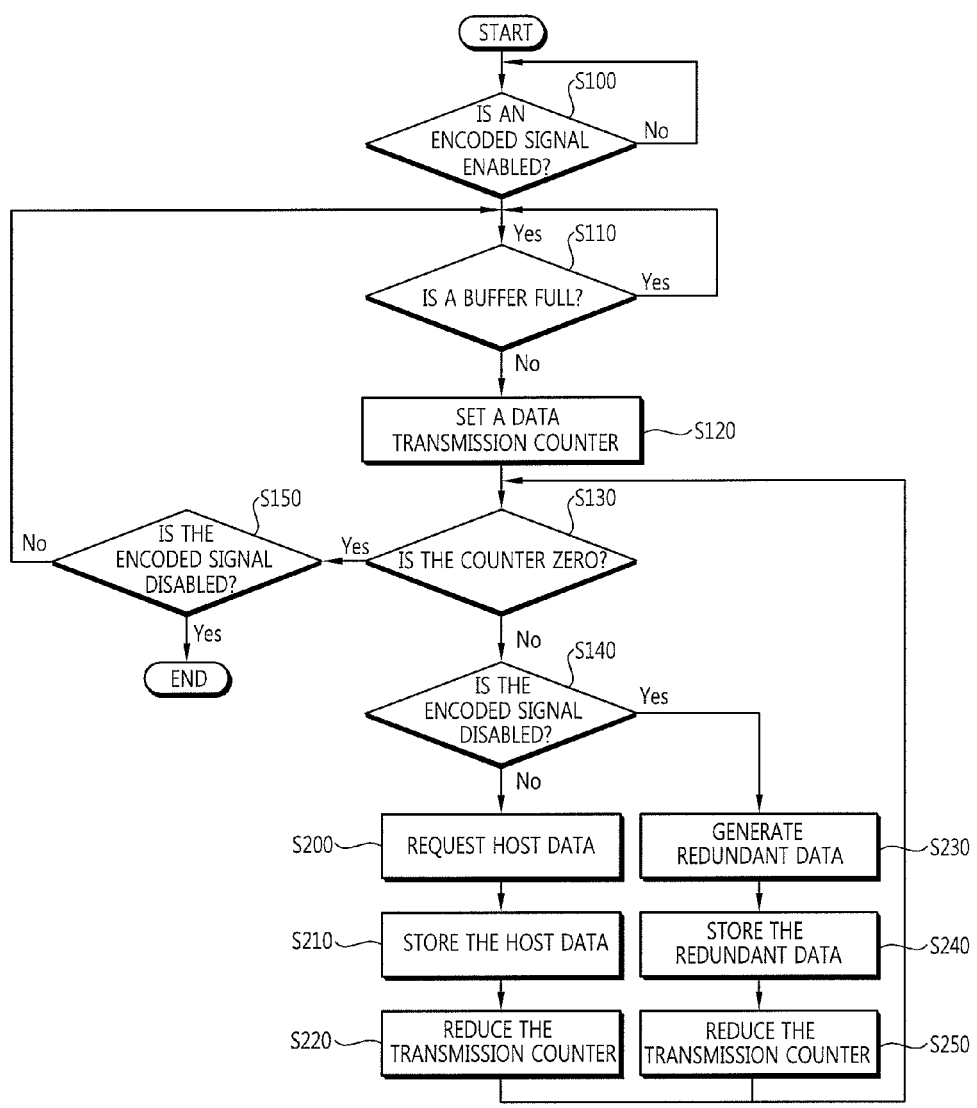
FIG. 5 is a flowchart illustrating a method of processing data to be recorded.

FIG. 5 is a flowchart illustrating a method of processing data to be recorded. As shown in FIG. 5, the interface controller 202 checks whether an encoded signal that is input from the micom 131 of the optical information processing device 130 is enabled (operation S100). When the encoded signal is enabled, the interface controller 202 checks whether data of the interface buffer 203 is full by checking a buffer state signal (BSS) of the interface buffer 203 (operation S110).

When it is checked that the interface buffer 203 is empty, the interface controller 202 calculates the number of transmissions which is required in a case where the interface controller 202 transmits host data to be recorded to the interface buffer 203 and sets a necessary data transmission counter based on the calculation result (operation S120).

At this time, the data transmission counter may depend on the minimum value of the host data that is transmitted from the host interface 110 and a size of a data page with a data format of the holographic optical information processing device 130.

Accordingly, when the data transmission counter of the host data is zero, it is determined that host data sufficient to construct a data page is transmitted. Thus, the interface controller 202 determines whether a data page is constructed by determining whether the data transmission counter is zero by checking the data transmission counter (operation S130). At this time, when the data transmission counter is zero, it is determined whether the encoded signal is disabled (operation S150). When the encoded signal is disabled, the data processing task is terminated. Alternatively, when the encoded signal is not disabled, the host data to be recorded is continued. Thus, operations are repeated from operation S110.

On the contrary, when the data transmission counter is not zero, it is determined that a data page is not constructed. However, since transmission of the encoded data may be stopped in this case, it has to be checked whether the encoded signal is disabled (operation S140) That is, it has to be checked again whether an end part of the host data is transmitted before the data page is constructed.

At this time, when the encoded signal is not disabled, that is, when the encoded signal is enabled, a signal for requesting the host data to be transmitted to the host information device 100 (HD_TRQ signal) is transmitted to the host information device 100 (operation S200).

Then, when the host information device 100 receives a signal for requesting transmission the host data and when the host information device 100 transmits an ACK signal and the host data in response to the received signal, the transmitted host data is transmitted and stored to and in the interface buffer 203 through the buffer controller 204 (operation S250). Then, when storing of the transmitted host data is completed, the data transmission counter is reduced by reverse counting the data transmission counter (operation S220). On the other hand, when the data transmission counter is zero while buffering the host data, it is determined again whether an encoding process is being performed. When the encoding process is stopped, a data interfacing process for the encoding process is stopped. Alternatively, when the data transmission counter is not zero, the interface controller 202 enables the host data to be sequentially transmitted to the interface buffer 203 by repeating the aforementioned procedures.

On the other hand, it is determined whether a data page is constructed in the operation of checking the data transmission counter (operation S130). At this time, when it is determined that a data page is not constructed and when it is determined that the encoded signal is disabled in the next operation (operation S140), it may be determined that there is no host data to be transmitted to the host information device 100.

However, since a data page has to be constructed in this case, redundant data for constructing a data page is generated (operation S230), and the redundant data is stored in the interface buffer 203 (operation S240). Then, the data transmission counter is successively reduced (operation S250). That is, the aforementioned processes are repeated until the data transmission counter becomes zero, that is, until a data page is completely constructed.

Here, there may be various methods of generating redundant data. In addition, it is possible to inform that data subsequent to end patterns is redundant data in a decoding procedure by defining first data of the redundant data as the end patterns that is specific patterns for indicating ends of the host data (refer to FIG. 4).

Hereinafter, data of the interface buffer 203 is displayed on the SLM via the ECC encoder 220 and the modulator 240 and recorded as a hologram in a recording medium.

Figure 6:
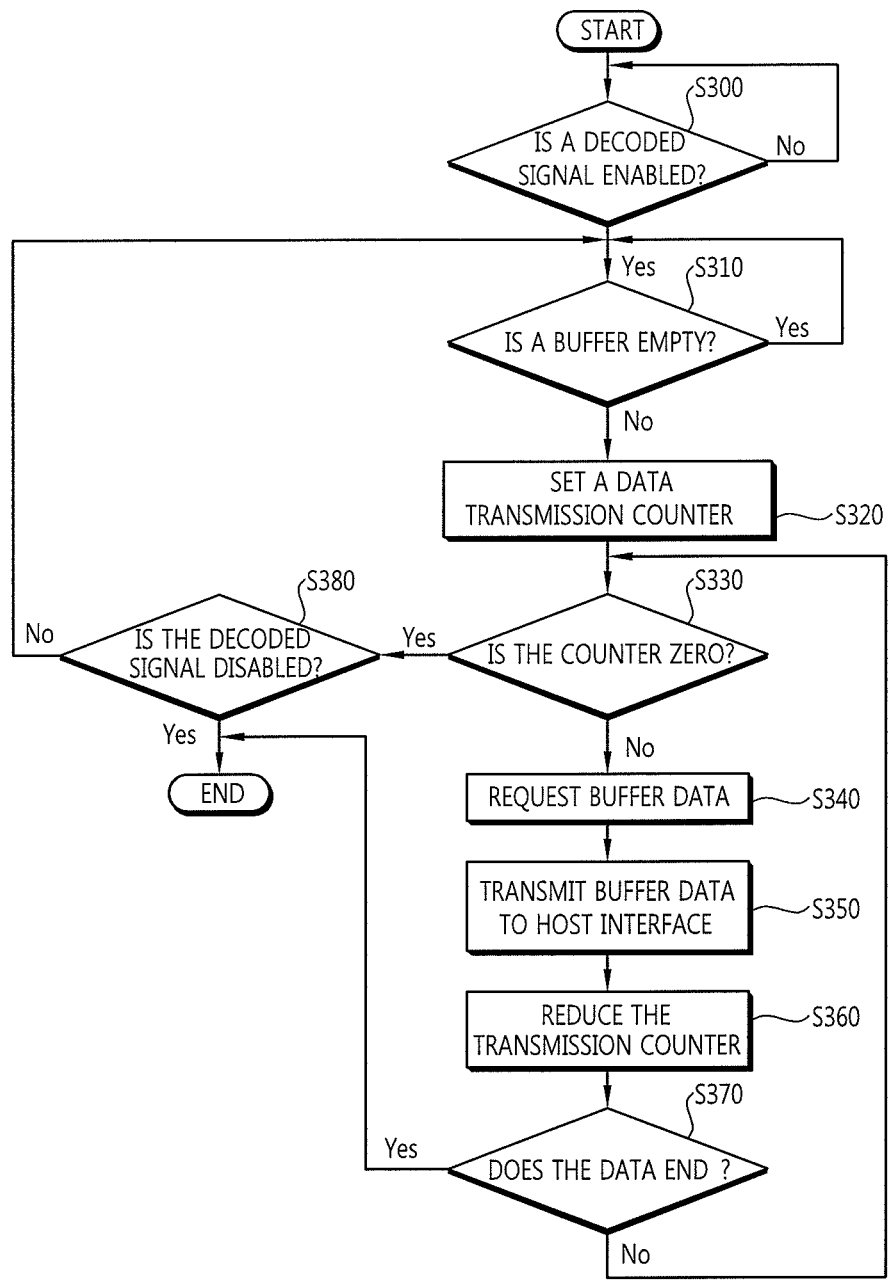
FIG. 6 is a flowchart illustrating a method of processing data to be reproduced.

FIG. 6 is a flowchart illustrating a method of processing data to be reproduced.

As shown in FIG. 6, when optical information is reproduced from a recording medium, decoded data is transmitted to the interface buffer 203 via the demodulator 250 and the ECC decoder 230 and buffered in the interface buffer 203.

At this time, the interface controller 202 determines whether a decoded signal that is input from the micom 131 of the optical information processing device 130 is enabled (operation S300). When it is determined that the decoded signal is enabled, the interface controller 202 checks whether the interface buffer 203 is empty by checking a state of the interface buffer 203 (operation S310). At this time, in a case where decoded data exists in the interface buffer 203, the interface controller 202 sets a data transmission counter for counting the number of transmissions when the decoded data is transmitted from the interface buffer 203 (operation S320).

A data transmission counter when reproducing data may be different from a data transmission counter when recording data. Then, in a case where the data transmission counter when reproducing data and the data transmission counter when recording data are zeros, it may be determined that a data page is completely transmitted (operation S330).

On the contrary, since a data page desired by the host information device 100 exists in a case where the data transmission counter is not zero, the interface controller 202 requests the interface buffer 203 to transmit decoded data (operation S340). Then, the interface controller 202 enables data of the interface buffer 203 to be transmitted to the host interface 110 (operation S350). The aforementioned processes are repeated until the data page is completely transmitted to the host information device 100.

On the other hand, when transmission of all the reproduced hologram (data page) is completed, the decoded signal is disabled. Then, the interface controller 202 senses that the decoded signal is disabled and terminates the decoding process.

Then, data that is recorded in the holographic optical information processing device may not be exactly matched with a unit of data page. At this time, the last page is constructed by using arbitrary redundant data when recording data. Accordingly, if a signal corresponding to the end patterns is detected when decoding data, it is determined whether data ends, and thereafter, the decoded data is recognized as redundant data (operation S370).

That is, even when transmission of a data page is not completed, that is, even when the data transmission counter is not zero, if the data processor 201 continuously monitors decoded data and detects end patterns, subsequently input data that is redundant data is not used to reproduce information. Thus, an ACK signal is disabled so that the redundant data is not transmitted to the host interface 110 (operation S380).

As described above, description on a signal that is transmitted and received between the host interface 100 and the data interface 200 of the channel electronics 120 is an exemplary embodiment. The data interface 200 with the host information device 100 may have various structures. Accordingly, signals for operations may be added, modified, or deleted.

What is claimed is:

1. A data processing system for recording holographic optical information, the data processing system comprising:
   a data interface constructing a data page by using data transmitted from a host information device and including an end pattern indicating an end of the data transmitted from a host information device;
   a memory storing data transmitted from the data interface;
   an encoder ECC-encoding data that is stored in the memory; and
   a modulator modulating the ECC-encoded data so as to record optical information.

2. The data processing system of claim 1, wherein the data interface includes a buffer temporarily storing data corresponding to a data page.

3. The data processing system of claim 2, wherein the data interface includes an interface controller checking whether a data page is buffered in the buffer.

4. The data processing system of claim 1, wherein the data interface includes a microcomputer interface controlling an encoded signal provided by a microcomputer of a holographic optical information processing device.

5. The data processing system of claim 1, wherein the data interface includes a buffer to store the data page, where the data interface waits until the buffer is empty before constructing the data page.

6. A data processing system for reproducing holographic optical information, the data processing system comprising:
   a memory storing optical information of a data page reproduced by an optical information processing device, the data page including an end pattern indicating an end of the data;
   a demodulator demodulating the optical information stored in the memory;
   a decoder ECC-decoding data that is demodulated by the demodulator; and
   a data interface transmitting the ECC-decoded data to a host information device based on monitoring the ECC-decoded data for the end pattern.

7. The data processing system of claim 6, wherein the data interface includes a buffer temporarily storing data corresponding to a data page.

8. The data processing system of claim 7, wherein the data interface includes an interface controller checking whether a data page is buffered in the buffer.

9. The data processing system of claim 6, wherein the data interface includes a microcomputer interface controlling a decoded signal provided by a microcomputer of a holographic optical information processing device.

10. The data processing system of claim 6, wherein the data interface includes a buffer to store the ECC-decoded data, where the data interface waits until the buffer is not empty before transmitting the ECC-decoded data to the host information device.

11. A method for reproducing holographic optical information, the method comprising:
   storing optical information of a data page reproduced by an optical information processing device in a memory, the data page including an end pattern indicating an end of data;
   demodulating the optical information stored in the memory using a demodulator;
   error correction code (ECC) decoding data that is demodulated by the demodulator;
   monitoring the ECC-decoded data for an end pattern; and
   transmitting the ECC-decoded data to a host information device based on the monitoring of the ECC-decoded data.

12. The method of claim 11, wherein the transmitting comprises determining data subsequent to a detected end pattern comprises redundant data.

* * * * *